(12) United States Patent
Fettig et al.

(10) Patent No.: US 10,205,937 B2
(45) Date of Patent: Feb. 12, 2019

(54) CONTROLLING LENS MISALIGNMENT IN AN IMAGING SYSTEM

(71) Applicant: Apple Inc., Cupertino, CA (US)

(72) Inventors: Douglas J. Fettig, San Jose, CA (US); Gennadiy A. Agranov, San Jose, CA (US); Gershon Rosenblum, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/498,507

(22) Filed: Apr. 27, 2017

(65) Prior Publication Data

US 2018/0041755 A1 Feb. 8, 2018

Related U.S. Application Data

(60) Provisional application No. 62/369,773, filed on Aug. 2, 2016.

(51) Int. Cl.
*H04N 5/357* (2011.01)
*H04N 5/369* (2011.01)
*H04N 17/00* (2006.01)
*H01L 27/146* (2006.01)
*H04N 5/217* (2011.01)

(52) U.S. Cl.
CPC ..... *H04N 17/002* (2013.01); *H01L 27/14605* (2013.01); *H04N 5/2176* (2013.01); *H04N 5/3572* (2013.01); *H04N 5/3696* (2013.01); *H01L 27/14623* (2013.01); *H01L 27/14627* (2013.01)

(58) Field of Classification Search
CPC .. H04N 5/3772; H04N 5/2176; H04N 5/3696; H04N 17/002; H04N 5/3572; H01L 27/14623; H01L 27/14605; H01L 27/14627; G02B 7/285; G02B 7/32; G02B 7/40
USPC ...... 348/208.12, 326, 325, 345–357, 208.99; 396/79, 93, 104, 359, 696, 698; 250/201.4, 201.6; 352/139, 140; 359/696, 698; 382/255
See application file for complete search history.

(56) References Cited

U.S. PATENT DOCUMENTS

2006/0147113 A1 7/2006 Han et al.
2012/0193515 A1* 8/2012 Agranov ............... G01S 3/782
250/208.1

(Continued)

OTHER PUBLICATIONS

International Application # PCT/US2017/38641 search report dated Aug. 17, 2017.

*Primary Examiner* — Marly S Camargo
(74) *Attorney, Agent, or Firm* — D. Kligler IP Services Ltd.

(57) ABSTRACT

An imaging method includes imaging a scene using an imaging system, which includes an array of radiation sensing elements, including first sensing elements with symmetrical angular responses and second sensing elements with asymmetrical angular responses, interspersed among the first sensing elements, and optics configured to focus radiation from the scene onto the array. The method further includes processing first signals output by the first sensing elements in order to identify one or more areas of uniform irradiance on the array, and processing second signals output by the second sensing elements that are located in the identified areas, in order to detect a misalignment of the optics with the array.

16 Claims, 8 Drawing Sheets

(56) References Cited

U.S. PATENT DOCUMENTS

2013/0038691 A1* 2/2013 Agranov .............. H04N 13/229
   348/46
2013/0222552 A1* 8/2013 Agranov .............. H04N 13/286
   348/49
2015/0062422 A1 3/2015 Stern
2015/0312461 A1* 10/2015 Kim .................. H01L 27/14609
   348/308

* cited by examiner

CONTROLLING LENS MISALIGNMENT IN AN IMAGING SYSTEM

CROSS-REFERENCE TO RELATED APPLICATION

This application claims the benefit of U.S. Provisional Patent Application 62/369,773, filed Aug. 2, 2016, which is incorporated herein by reference.

FIELD OF THE INVENTION

The present invention relates generally to imaging systems, and particularly to detecting misalignment of imaging optics.

BACKGROUND

Compact digital imaging systems are ubiquitous in portable digital devices, such as mobile phones and tablet computers. A typical system comprises an imaging lens and an image sensor, e.g., a sensing element array, located in the image plane of the optics. In some applications, it is advantageous to have the image sensor guide the focusing of the imaging lens.

SUMMARY

Embodiments of the present invention that are described hereinbelow provide methods and apparatus for detecting lens misalignment in an optical imaging system.

There is therefore provided, in accordance with an embodiment of the invention, a method for imaging. The method includes imaging a scene using an imaging system, including an array of radiation sensing elements. The array includes first sensing elements with symmetrical angular responses and second sensing elements with asymmetrical angular responses, interspersed among the first sensing elements, and optics configured to focus radiation from the scene onto the array. The method includes processing first signals output by the first sensing elements in order to identify one or more areas of uniform irradiance on the array and processing second signals output by the second sensing elements that are located in the identified areas, in order to detect a misalignment of the optics with the array.

In an embodiment, the second sensing elements include a photosensitive region formed in a substrate, a microlens disposed over the photosensitive region, and an opaque shield interposed between the substrate and the microlens, partially covering the photosensitive region. Additionally or alternatively, the second sensing elements include at least one photosensitive region formed in a substrate and a microlens, which is disposed over the photosensitive region, wherein the at least one photosensitive region is offset with respect to an optical chief ray directed at the sensing element through the microlens.

In an embodiment, processing the second signals includes monitoring a transverse shift of the optics relative to the array, and monitoring the transverse shift includes calculating a gain for the second sensing elements in the identified areas, by normalizing the second signals relative to the first signals output by the first sensing elements in the identified areas, evaluating a deviation of the calculated gain from a stored gain, and estimating the transverse shift based on the deviation.

In a another embodiment, the second sensing elements include different groups of the second sensing elements having different, respective angles of asymmetry, and monitoring the transverse shift includes comparing the second signals output by the different groups in order to evaluate a direction of the transverse shift.

In yet another embodiment, processing the second signals includes monitoring a tilt of the optics relative to the array.

In an embodiment, processing the second signals includes storing respective gain maps for a plurality of types of misalignment, calculating a gain for the second sensing elements in the identified areas, by normalizing the second signals relative to the first signals output by the first sensing elements in the identified areas, and comparing the calculated gain to the stored gain maps in order to identify a type and magnitude of the misalignment.

In a further embodiment, processing the second signals includes evaluating an angle of an optical chief ray of the optics across the array. Additionally or alternatively, processing the second signals includes calibrating an alignment of the imaging system based on the second signals. Still additionally or alternatively, processing the second signals includes verifying that the imaging system has been assembled to within a predetermined tolerance based on the second signals.

There is also provided, in accordance with an embodiment of the invention, an imaging system. The imaging system includes an array of radiation sensing elements, including first sensing elements with symmetrical angular responses and second sensing elements with asymmetrical angular responses, interspersed among the first sensing elements, optics configured to focus radiation from the scene onto the array, and control circuitry coupled to the array. The control circuit is configured to process the first signals in order to identify one or more areas of uniform irradiance on the array and to process the second signals output by the second sensing elements that are located in the identified areas in order to detect a misalignment of the optics with the array The present invention will be more fully understood from the following detailed description of the embodiments thereof, taken together with the drawings in which:

DETAILED DESCRIPTION OF EMBODIMENTS

Figure 1:
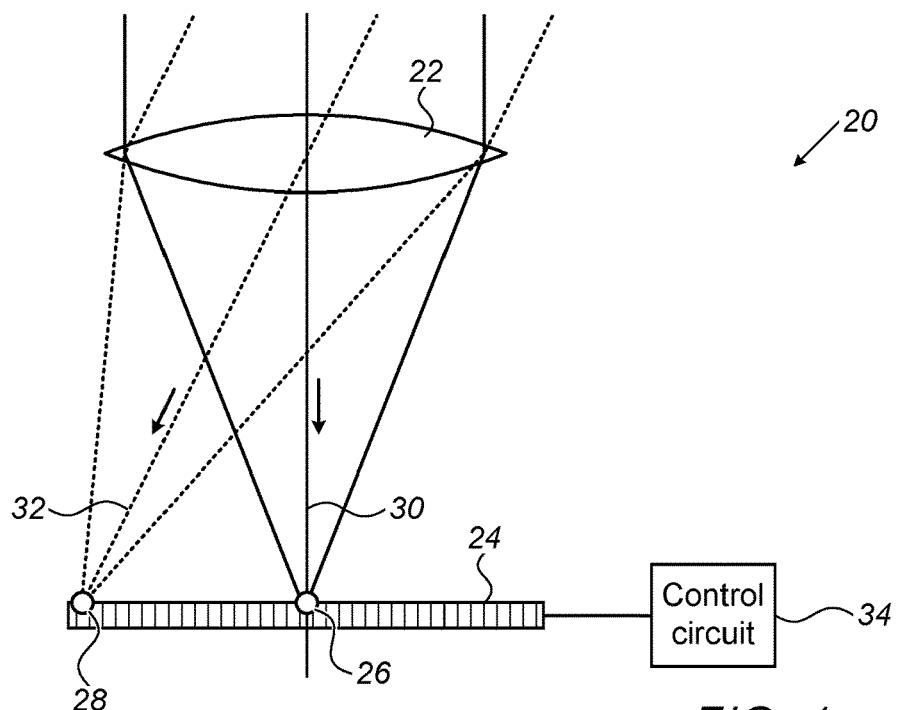
FIG. 1 is a schematic illustration of an imaging system, in accordance with an embodiment of the invention.

The position and tilt of the imaging lens relative to the image sensor plays a critical role in an imaging system. Some imaging systems are particularly sensitive to the misalignment of the lens relative to the image sensor. Examples of such systems include, but are not limited to, a variety of depth sensing imaging systems utilizing structured light and based on the principle of triangulation. A change of the position or tilt of the lens relative to the image sensor during the lifetime of the depth sensing system may result in a significant error in the estimation of the depth. Other examples of systems sensitive to lens misalignment include cameras, where a misalignment of the lens during the lifetime of the camera may result in a reduced spatial resolution across the field of view of the camera.

Embodiments of the present invention that are described herein provide cost-effective methods for controlling the misalignment of the imaging lens, as well as apparatus implementing these methods. The methods are based on utilizing sensing elements that exhibit asymmetrical angular sensitivities. These asymmetrical sensing elements are interspersed among the regular, symmetrical sensing elements of the image sensor, taking up a small fraction, for example up to few percent, of the sensing element sites.

An asymmetrical sensing element is created, for instance, by either inserting an opaque shield, partially covering the sensing element, between the photosensitive area of the sensing element and a microlens that collects light onto the sensing element, or by offsetting the photosensitive area from its symmetrical position under the microlens. The direction of the angular asymmetry is determined by which part of the photosensitive area is covered by the shield, or to which direction the photosensitive area is offset. Having two photosensitive areas offset in opposite directions under a single microlens yields enhanced directional sensitivity, and having a 2×2 array of photosensitive areas under the microlens yields two orthogonal directions with enhanced directional sensitivity. Alternatively, other techniques may be used in engendering an asymmetrical sensing response, as will be apparent to those skilled in the art.

Modern imaging systems are often equipped with non-telecentric imaging lenses, especially when used in mobile devices with low-profile optics. For a sensing element in the center of the field of view, the optical chief ray is normal to the image sensor, but the chief ray may deviate from normal by as much as 30° for sensing elements at the edge of the field of a non-telecentric system. In order for off-center symmetrical sensing elements to have a response that is angularly symmetrical, the microlens is shifted relative to the photosensitive area so that the optical axis of symmetry coincides with the chief ray angle. An asymmetrical sensing element in an off-center position of the field will have its microlens similarly shifted, but in addition an angular asymmetry around the local optical chief ray is generated, for example by one of the methods described above.

Consider now two asymmetrical sensing elements in essentially the same location on the field of view (for example, adjacent sensing elements), with the same amount of asymmetry, but in opposite directions. For clarity of description, but without detracting from the generality of the embodiment, we will relate to imaging lens shifts and to sensing element asymmetries in a single plane containing the optical axis of the imaging system, and we will call the shift directions left and right, and the two sensing elements left element and right element. (By the same token, the directions could be "up" and "down," or in both diagonal directions.) Since these two sensing elements are arranged symmetrically around the local optical chief ray, they will receive the same amount of radiation and output the same signal, provided that spatially the local irradiance on the image sensor is uniform, and that the imaging lens is in nominal alignment.

If now the imaging lens were to shift transversely (perpendicularly to its optical axis), the entire set of chief rays across the image plane would shift with it, the angular balance between left and right sensing elements would be altered, and the left and right sensing elements would output unequal signals. In this manner a transverse shift of the imaging lens is translated into an imbalance between the signals output by the left and right asymmetrical sensing elements. This imbalance can now be utilized either as a feedback signal for a corrective action, or—knowing the sensitivity of the signal imbalance with respect to the lens shift—can be used for calculating the amount of shift. The above-mentioned condition for uniform irradiance can be ascertained by using the symmetrical sensing elements in the sensing element array to monitor the irradiance in a manner that is insensitive to the chief ray angle, and to identify areas of uniform irradiance for the shift measurement. In the context of the present description and in the claims, the irradiance is considered to be "uniform" over a given area of an image if there are no high-contrast edges in the area. An area of an image can be considered to contain a high-contrast edge, for example, if the pixel luminance levels within the area vary by more than a certain, specified threshold, such as by more than 10% across four adjacent pixels.

In a disclosed embodiment, a metric for a transverse (left/right) shift of the imaging lens is determined using the following algorithm:
1. Identify in the field of view an area where the irradiance is uniform to within a predetermined threshold;
2. Calculate the mean signal output by the symmetrical sensing elements within the identified area;
3. Calculate for each left/right asymmetrical sensing element a gain value, which, by multiplying the signal of the asymmetrical sensing element with this gain, would bring the result to the level of the mean signal;
4. Calculate the deviation of the calculated gain value from a map of stored gain values for each asymmetrical sensing element; and
5. Calculate the metric for the transverse shift as the average of the gain deviations over the identified area.

In other embodiments, the signals output by the asymmetrical sensing elements in different areas of the array are used for evaluation of multiple components of the misalignment of the imaging lens. The evaluation is based on the fact that each degree of freedom of the lens movement produces a distinct map of gain deviations over the array of sensing elements. These degrees of freedom include movements of the lens as a rigid body (such as transverse shift along either of the transverse axes, a shift along the focus axis, and a tilt around either of the transverse axes), as well as movements of internal lens elements with respect to each other (such as internal transverse shifts, vertical shifts, and tilts). These maps are used as signatures for each degree of freedom, allowing a separate detection of the different movements of the imaging lens and its components, as well as enhancing the sensitivity of the measurement. The gain deviations, weighted by a specific gain deviation map, are averaged to yield a metric for the respective movement of the imaging lens. In this way, for example, a metric for the tilt of the imaging lens is extracted by calculating a weighted gain deviation average, wherein the weights are obtained from a tilt-specific gain deviation map.

The metrics, both as calculated above and as translated into actual shifts and tilts using appropriate sensitivity figures, may either be compared to preset thresholds for indicating a need for a corrective action (raising a "flag") or used as a continuous metrics, for example in the following applications:
a) In production of the imaging system:
 i. Monitor assembly tolerances;
 ii. Identify faulty assemblies;
 iii. Measure the actual position of the assembled lens for initial calibration;
b) In use of the imaging system:
 i. Identify alignment drift, using the metric as a feedback signal to guide a re-calibration of the asymmetric sensing elements and the overall imaging system, including its imaging processing algorithms;
 ii. Drive compensation of lens position change due to temperature change;
 iii. Identify a significant misalignment of the lens during the use of the imaging system, such as due to a mechanical shock, requiring either a re-alignment or repair of the imaging system;
 iv. Build and monitor a map of optical chief ray angles, for optimizing the use of sensing elements and for monitoring the overall optical behavior of the imaging lens;
 v. Monitoring the imaging system periodically and/or after a known event (e.g. mechanical shock);
 vi. Record a time-average and trends of the metric for increased accuracy for determining the misalignment of the imaging lens.

In a normal image capture, the signal values output by the asymmetric sensing elements may be multiplied by the values of the map of stored gain values and used in outputting pixel values in conjunction with the pixel values from the symmetrical sensing elements, thus preserving full image resolution. Standard algorithms for defect correction may also be applied after correcting for the gain in order to further improve the image quality.

FIG. 1 is a schematic illustration of an imaging system 20, in accordance with an embodiment of the invention. The imaging system comprises an imaging lens 22, a sensing element array 24 located in the image plane of the imaging lens, and a control circuit 34 connected to the sensing element array. By way of illustration, lens 22 focuses light from a scene onto a point 26 located in the center of the field of view of imaging system 20, and a point 28 located in the periphery of the field of view. A chief ray 30, aimed at point 26, impinges on the sensing element array at a normal angle, whereas a chief ray 32, aimed at point 28, impinges on the sensing element array at a non-normal angle due to the non-telecentricity of imaging system 20. As mentioned above, the deviation of chief ray 32 from normal may be up to 30°.

Based on the signals from array 24, control circuit 34 detects misalignment between imaging lens 22 and array 24, as described in detail hereinbelow. In some embodiments, control circuit 34 comprises a general-purpose microprocessor or embedded microcontroller, which is programmed in software or firmware to carry out the methods of detection that are described herein. Additionally or alternatively, control circuit 34 comprises programmable or hard-wired logic circuits, which perform at least a part of these functions. All such implementations are considered to be within the scope of the present invention.

FIGS. 2-5 are schematic illustrations of sensing elements with asymmetrical angular responses that can be integrated in array 24.

Figure 2:
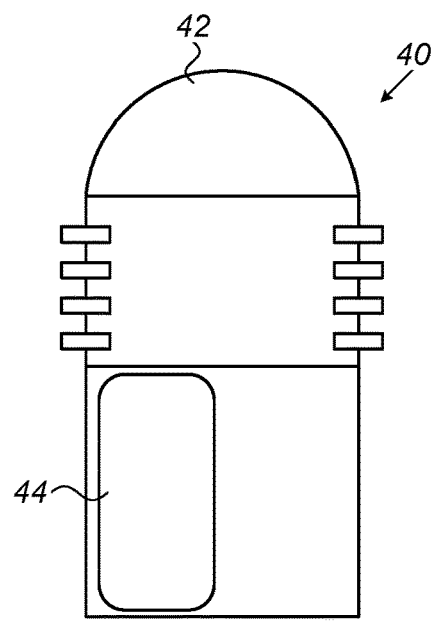
FIG. 2 is a schematic illustration of a sensing element with asymmetrical angular response, in accordance with an embodiment of the invention.

FIG. 2 is a schematic illustration of a sensing element 40 with asymmetrical angular response, in accordance with an embodiment of the invention. Sensing element 40 comprises a microlens 42, positioned above a photosensitive area 44. An asymmetrical angular response is achieved by configuring the photosensitive area in an offset position (as compared to a symmetrical position) under the microlens.

Figures 3, 4:
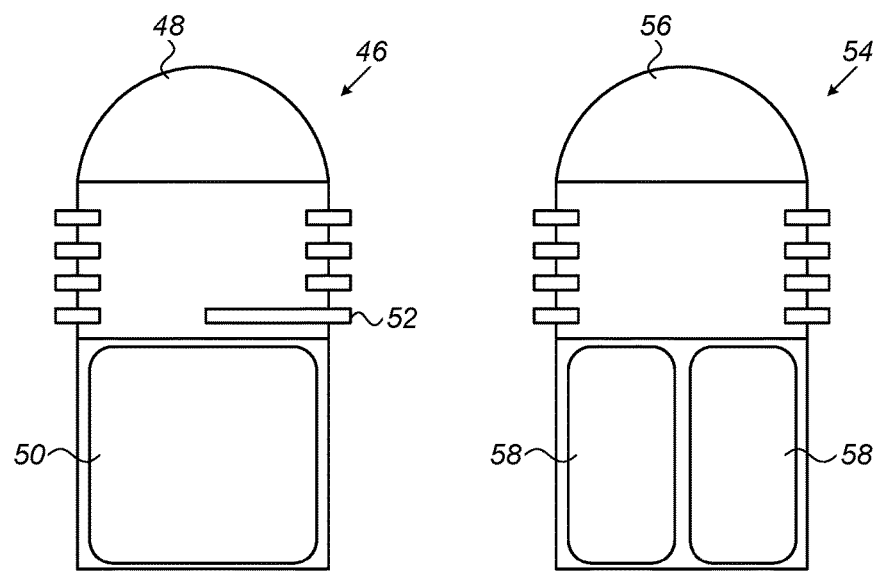
FIG. 3 is a schematic illustration of a sensing element with asymmetrical angular response, in accordance with another embodiment of the invention.
FIG. 4 is a schematic illustration of a sensing element with asymmetrical angular response, in accordance with yet another embodiment of the invention.

FIG. 3 is a schematic illustration of a sensing element 46 with asymmetrical angular response, in accordance with another embodiment of the invention. Sensing element 46 comprises a microlens 48, positioned above a photosensitive area 50, and an opaque shield 52 inserted between the microlens and the photosensitive area, partially covering the latter. It is the partial coverage by the shield that generates the asymmetrical angular response.

FIG. 4 is a schematic illustration of a sensing element 54 with asymmetrical angular response, in accordance with yet another embodiment of the invention. Sensing element 54 comprises a microlens 56, positioned above two photosensitive areas 58, symmetrically offset under the microlens.

The illustrated sensing element is an extension to the one shown in FIG. 2, in that the angular response from each of the photosensitive areas is asymmetrical, with the added feature that the two photosensitive areas have their angular responses offset in opposite directions.

Figure 5:
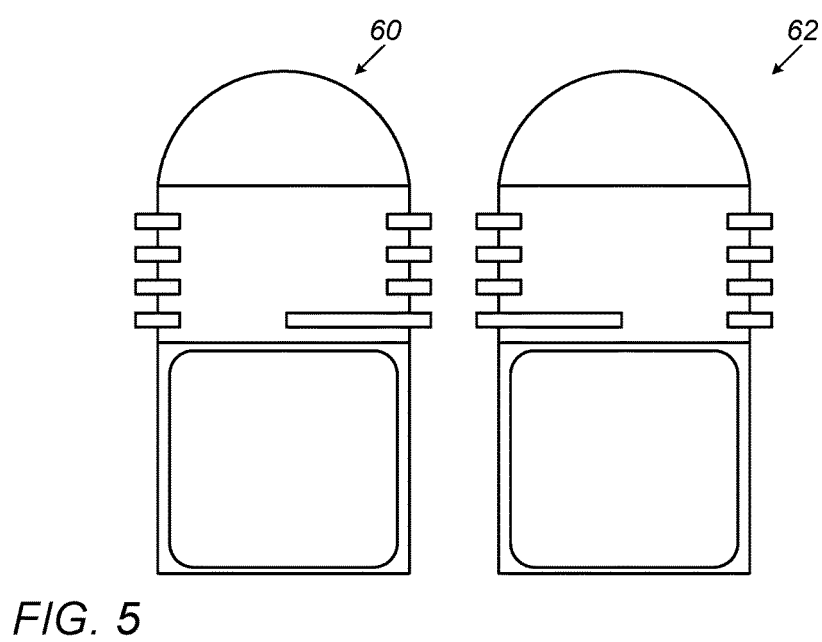
FIG. 5 is a schematic illustration of two sensing elements with opposite asymmetrical angular responses, in accordance with yet another embodiment of the invention.

FIG. 5 is a schematic illustration of two sensing elements 60 and 62, in accordance with a further embodiment of the invention. Sensing element 60 is identical to sensing element 46 of FIG. 3, and sensing element 62 is its mirror image. Sensing element 60 is more sensitive to radiation arriving from the right (in the view of FIG. 5), and sensing element 62 is more sensitive to radiation arriving from the left. For the sake of clarity, the subsequent detailed description will refer to these two sensing elements as the "right sensing element" for sensing element 60 and the "left sensing element" for sensing element 62.

The scope of the present invention is not limited in any way to these particular sensing elements, however, and the principles described herein may be applied using substantially any sorts of sensing elements with asymmetrical angular responses that are known in the art. The directions "left" and "right" are used arbitrarily and may refer to any directions in the image plane of the imaging system.

FIGS. 6-9 are schematic illustrations of rays traced to symmetrical and asymmetrical sensing elements in the center and in an off-center location of the field of view of an imaging system, such as system 20.

Figure 6:
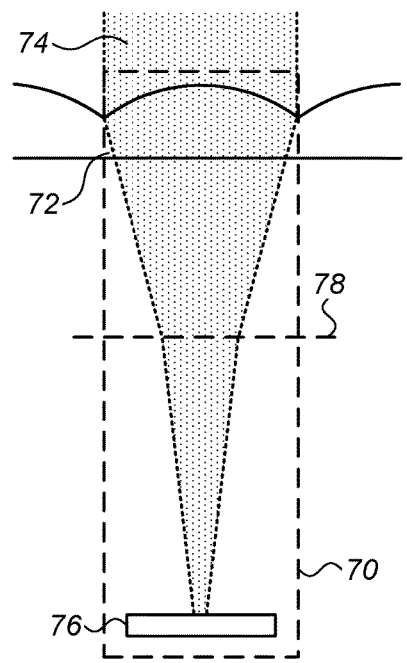
FIG. 6 is a schematic illustration of rays traced to a symmetrical sensing element from the center of the field of view of the sensing element, in accordance with an embodiment of the invention.
Figure 7:
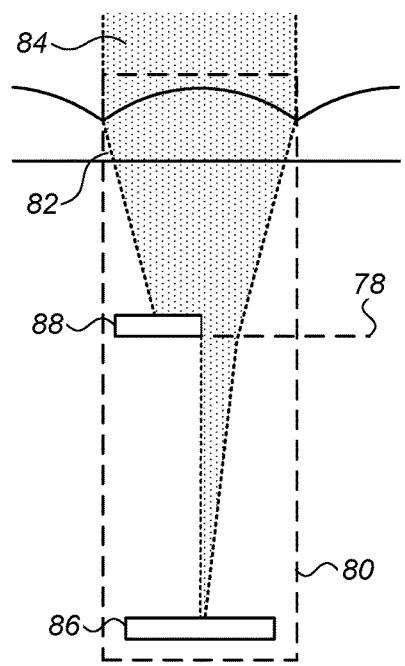
FIG. 7 is a schematic illustration of rays traced to an asymmetrical sensing element from the center of the field of view of the sensing element, in accordance with an embodiment of the invention.
Figure 8:
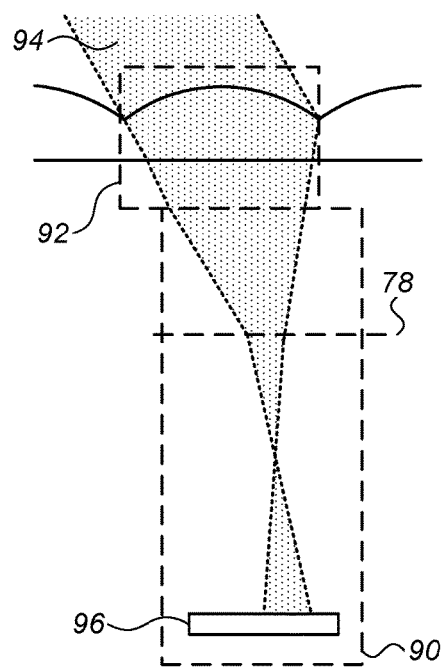
FIG. 8 is a schematic illustration of rays traced to a symmetrical sensing element from an off-center position in the field of view of the sensing element, in accordance with an embodiment of the invention.
Figure 9:
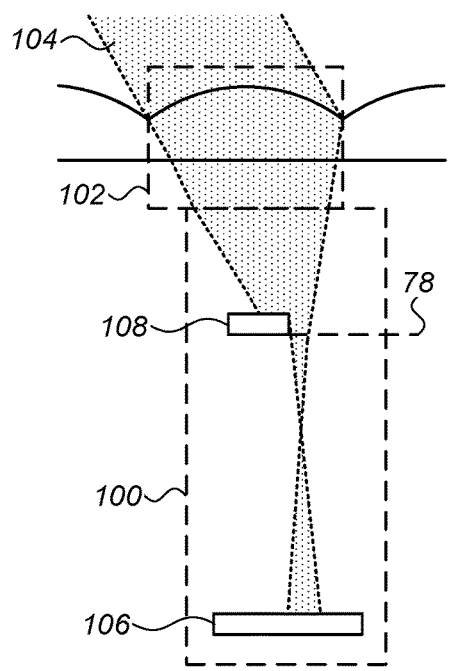
FIG. 9 is a schematic illustration of rays traced to an asymmetrical sensing element from an off-center position in the field of view of the sensing element, in accordance with an embodiment of the invention.

FIG. 6 is a schematic illustration of rays traced to a symmetrical sensing element 70 in the center of the field of view, in accordance with an embodiment of the invention. Symmetrical sensing element 70 comprises a microlens 72 (obscured by a traced ray bundle 74) and a photosensitive area 76. All of the rays in ray bundle 74 reach photosensitive area 76. The rays refract slightly at a dotted line 78, which denotes a transition from air to a solid material covering photosensitive area 76 (solid material not shown to enhance the clarity of the figure). In FIGS. 7-9 the transition from air to solid is similarly shown as dotted line 78.

FIG. 7 is a schematic illustration of rays traced to an asymmetrical sensing element 80 in the center of the field of view, in accordance with an embodiment of the invention. Similarly to symmetrical sensing element 70 (FIG. 6), asymmetrical sensing element 80 comprises a microlens 82 (obscured by a traced ray bundle 84) and a photosensitive area 86. In addition, the sensing element comprises an opaque shield 88 inserted between the microlens and the photosensitive area, partially covering the photosensitive area and blocking a part of the ray bundle. Roughly half of the rays traced in FIG. 7 reach the photosensitive area.

FIG. 8 is a schematic illustration of rays traced to a symmetrical sensing element 90 in an off-center position of the field of view with the optical chief ray at a 30° angle from the normal, in accordance with an embodiment of the invention. Similarly to symmetrical sensing element (FIG. 6), symmetrical sensing element 90 comprises a microlens 92 (obscured by a traced ray bundle 94) and a photosensitive area 96. The difference as compared to symmetrical sensing element 70 is that, due to the 30° oblique angle of the optical chief ray in the specific location in the field of view, microlens 92 has been offset in order to ensure that the entire ray bundle passed by the microlens reaches the photosensitive area.

FIG. 9 is a schematic illustration of rays traced to an asymmetrical sensing element 100 in an off-center position of the field of view with the optical chief ray at a 30° angle from the normal, in accordance with an embodiment of the invention. Similarly to symmetrical sensing element 90 (FIG. 8) in the same off-center position, asymmetrical sensing element 100 comprises a microlens 102 (obscured by a traced ray bundle 104), shifted to account for the oblique optical chief ray angle, and a photosensitive area 106. Similarly to asymmetrical sensing element 80 (FIG. 7), an opaque shield 108 has been inserted between the microlens and the photosensitive area so as to block part of the ray bundle, positioned so that roughly half of the ray bundle reaches the photosensitive area.

FIGS. 10-15 are schematic illustrations of simulated signals output by the sensing elements in the preceding embodiments. In FIGS. 10-14, a horizontal axis 120 represents the angle of incident radiation from −40° to +40°, and a vertical axis 122 represents signals in relative units.

Figure 10:
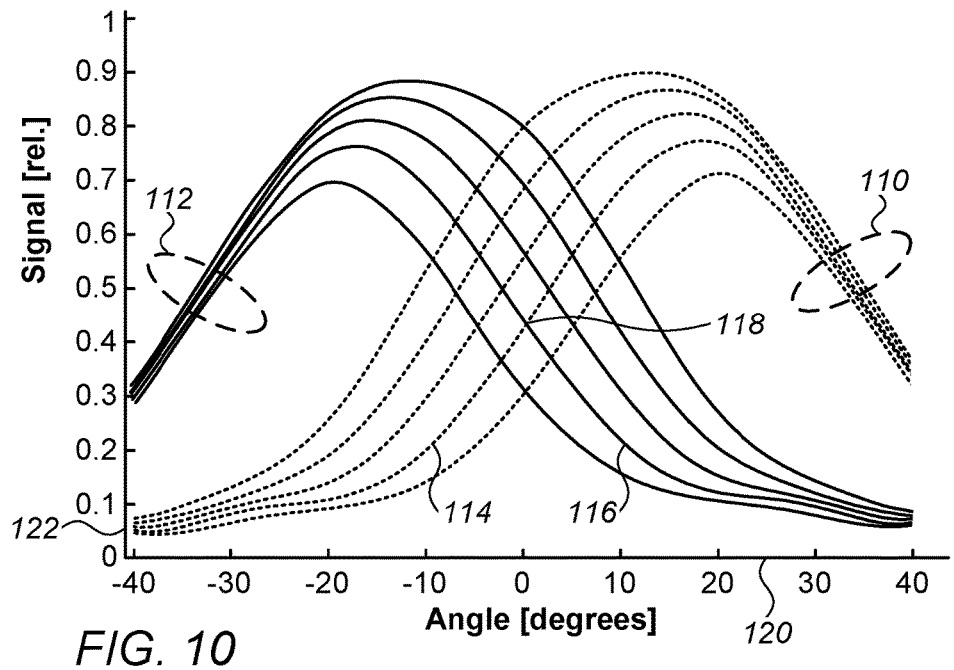
FIG. 10 is an illustration of the simulated angular response of left- and right-shielded sensing elements with different sizes of the shield, in accordance with an embodiment of the invention.

FIG. 10 is an illustration of the simulated angular responses of left and right shielded sensing elements for different sizes of the shield, in accordance with an embodiment of the invention. The curves in FIG. 10 portray signals output by left and right asymmetrical elements located at the center of the field of view, as a function of the angle of the incident radiation at the photosensitive area, hence the symmetry around the 0° angle. The individual curves correspond to different amounts of obscuration by the inserted opaque shield, as will be detailed below. A family 110 of curves illustrate the signals output by right asymmetrical sensing elements, and a family 112 of curves illustrate the signals output by left asymmetrical elements.

One curve 114 from family 110 (right asymmetrical sensing elements), for example, shows that at an angle of incident radiation of 18° (radiation incident from the right), a maximum of the signal is obtained, while the signal at perpendicular incidence (0°) is 55% of the maximum signal value at 18° angle of incidence. In a symmetrical fashion, a curve 116 from family 112 (left asymmetrical sensing elements) shows that at an angle of incident radiation of −18° (radiation incident from the left), a maximum of the signal is obtained, while the signal at perpendicular incidence (0°) is 55% of the maximum signal value at −18° angle of incidence. The two graphs cross at 0° at a point 118.

The curves below these two curves 114 and 116 relate to asymmetrical sensing elements with a larger obscuration by the opaque shield, whereas the curves above relate to smaller obscuration. A larger obscuration enhances the angular sensitivity of the asymmetrical sensing elements, while decreasing the signal-to-noise ratio. A smaller obscuration, on the other hand, reduces the angular sensitivity while increasing the signal-to-noise ratio. Thus the amount of obscuration can be optimized with respect to the two opposing performance factors of angular sensitivity and signal-to-noise ratio.

Figure 11:
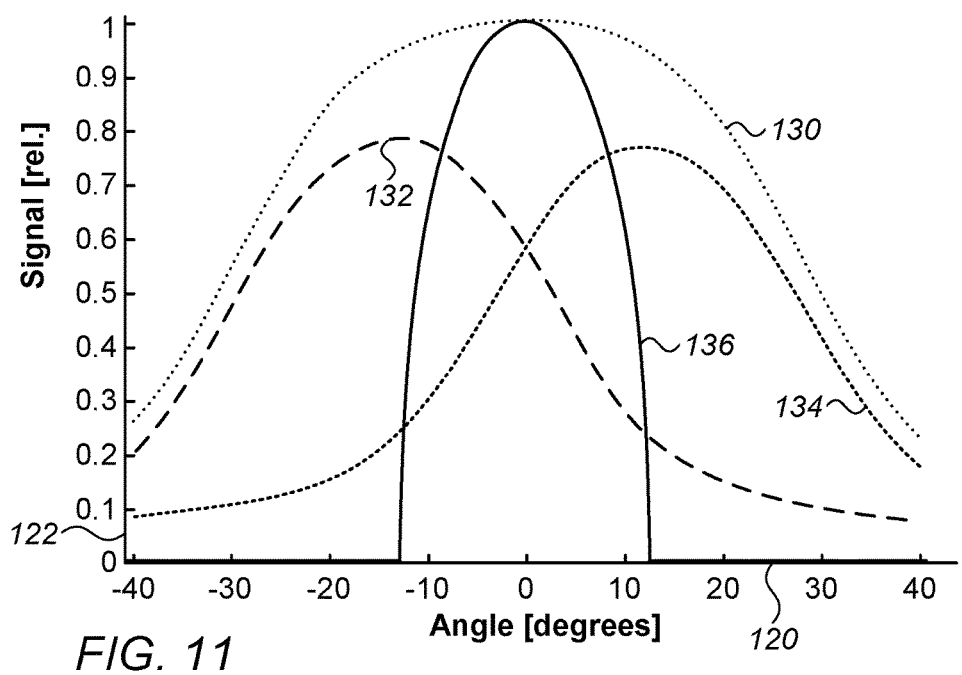
FIG. 11 is an illustration of simulated signals output by symmetrical and asymmetrical sensing elements in the center of the field of view of an aligned optical system, in accordance with an embodiment of the invention.

FIG. 11 is an illustration of simulated signals output by symmetrical and asymmetrical sensing elements in the center of the field of view of an aligned optical system, as a function of the angle of the incident radiation, in accordance with an embodiment of the invention. For the asymmetrical sensing elements, the opaque shield covers half of the photosensitive area. A curve 130 represents a signal from a symmetrical sensing element, whereas curves 132 and 134 represent signals from left and right asymmetrical sensing elements, respectively. The angular radiation distribution from an imaging lens, which focuses light onto the array of sensing elements with an f-number of 2.2 (f/2.2 lens), is also shown as a curve 136. In this case, the left and right asymmetrical sensing elements will output roughly equal signals. The symmetry of the signals is an indication that the optical system is symmetrically aligned. The same labelling of curves 130-136 is applied to FIGS. 12-14.

Figure 12:
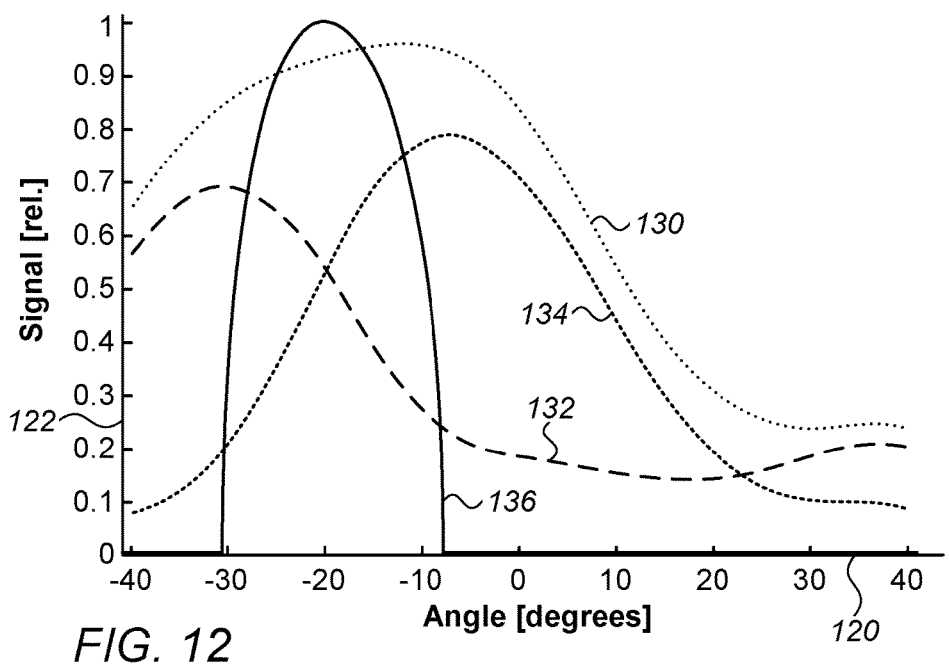
FIG. 12 is an illustration of simulated signals output by symmetrical and asymmetrical sensing elements in an off-center location of the field of view of an aligned optical system, in accordance with an embodiment of the invention.

FIG. 12 is an illustration of simulated signals output by symmetrical and asymmetrical sensing elements in an off-center location in the field of view, as a function of the angle of the incident radiation, in accordance with an embodiment of the invention. This example is computed for an optical chief ray angle of −20°, in an aligned optical system. The left and right asymmetrical sensing elements are balanced around the angle of incidence of −20°, as shown by the fact that their signals 132 and 134, respectively, are equal at this angle. The angular radiation distribution from the imaging lens, represented by curve 136, is also centered at this angle.

Figure 13:
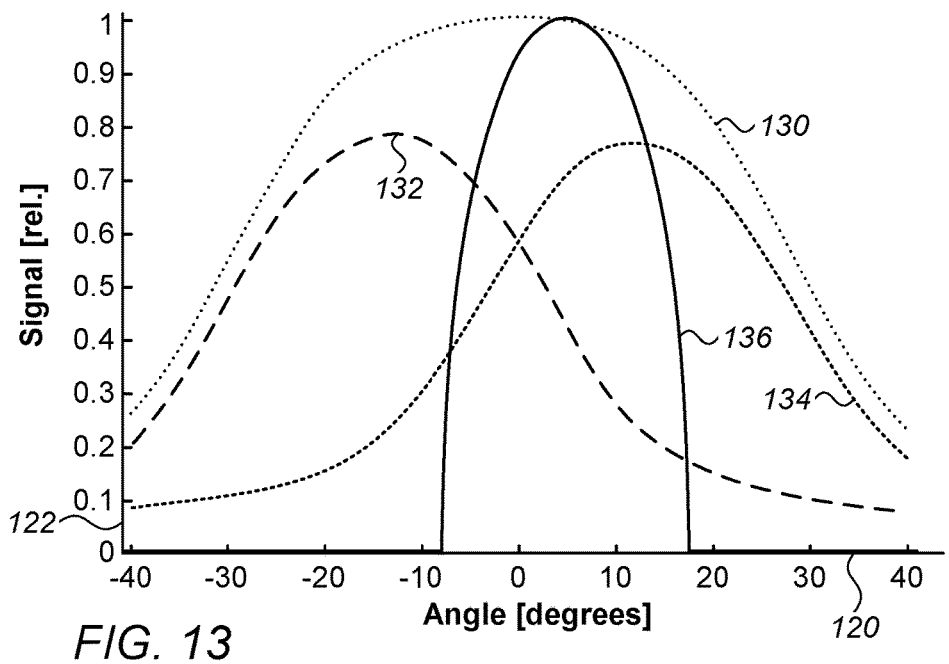
FIG. 13 is an illustration of simulated signals output by symmetrical and asymmetrical sensing elements in the center of the field of view of a misaligned optical system, in accordance with an embodiment of the invention.

FIG. 13 is an illustration of simulated signals output by symmetrical and asymmetrical sensing elements in the center of the field of view of an optical system, as a function of the angle of the incident radiation, in accordance with an embodiment of the invention. In this case, the imaging lens has been transversely shifted, resulting in a shift of +5° of the optical chief ray. The signals output by the sensing elements are identical to those of FIG. 11, but the angular radiation distribution from the f/2.2 imaging lens, as shown by curve 136, is now centered at +5°, and thus overlaps more strongly with the response curve of the right asymmetrical sensing elements and more weakly with that of the left asymmetrical sensing element. Therefore, as a result of the misalignment of the lens, the right asymmetrical sensing element will output a relatively stronger signal than the left asymmetrical sensing element.

Figure 14:
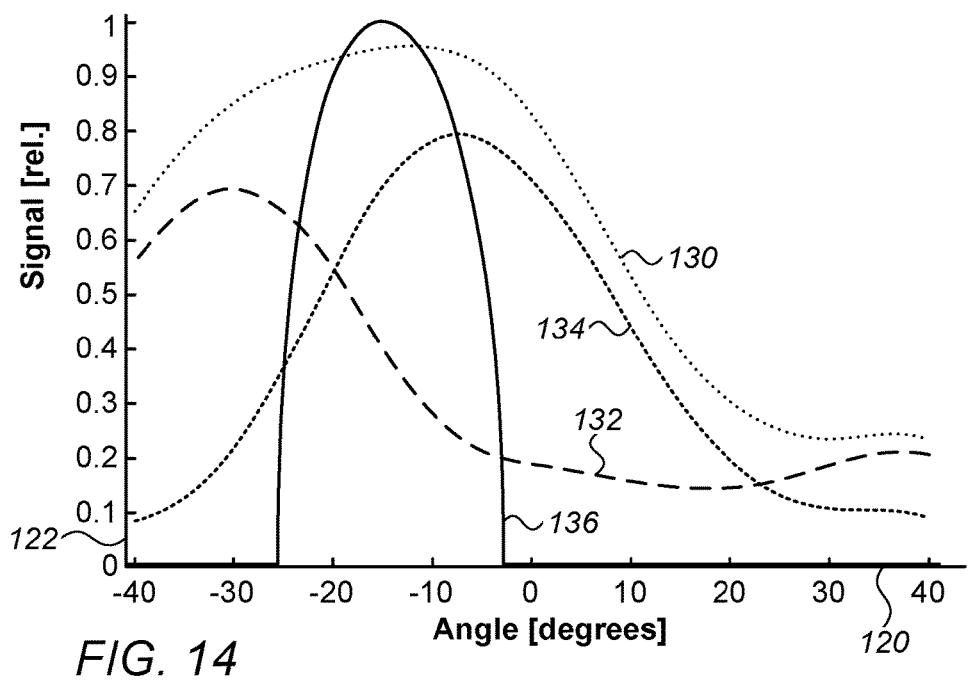
FIG. 14 is an illustration of simulated signals output by symmetrical and asymmetrical sensing elements in an off-center location in the field of view of a misaligned optical system, in accordance with an embodiment of the invention.

FIG. 14 is an illustration of simulated signals output by symmetrical and asymmetrical sensing elements in an off-center location of the field of view, with an optical chief ray angle of −20°, as a function of the angle of the incident radiation, in accordance with an embodiment of the invention. In this example, the imaging lens has again been transversely shifted, leading to a shift of +5° of the optical chief ray. The signals output by the sensing elements are identical to those of FIG. 12, but the angular radiation distribution from the f/2.2 imaging lens, shown by curve 136, is now shifted by 5° and is centered at −15°. Again, the misalignment of the imaging lens gives rise to a stronger signal from the right asymmetrical sensing element than from the left asymmetrical sensing element.

Figure 15:
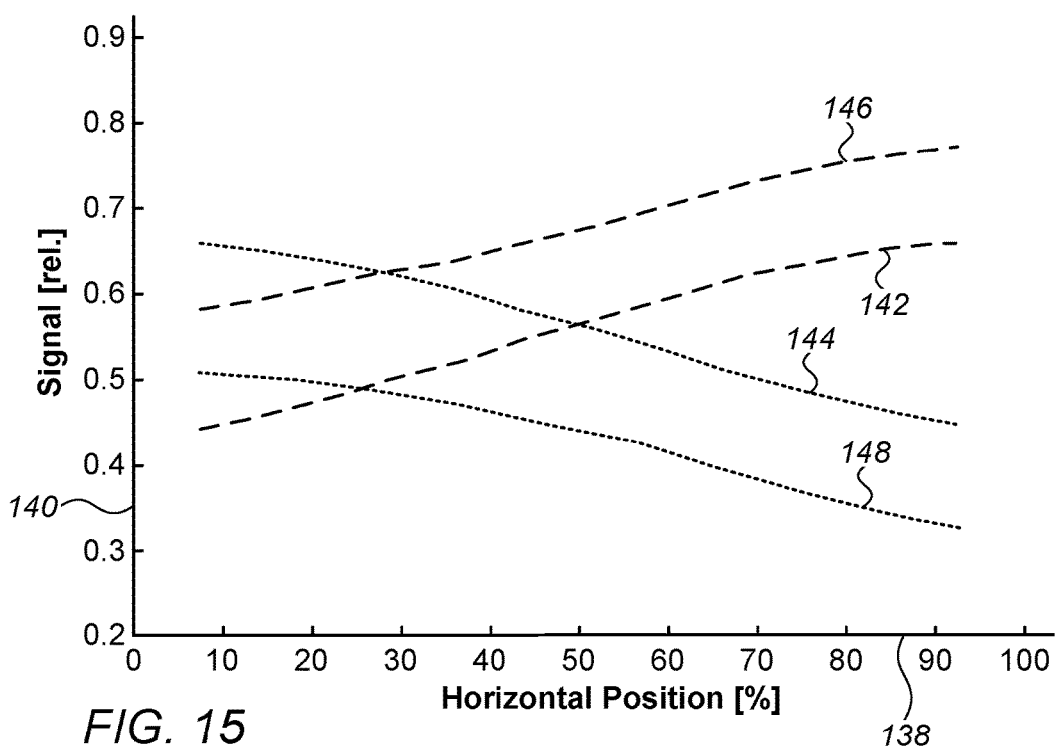
FIG. 15 is an illustration of simulated signals, integrated over the numerical aperture of an imaging lens, from asymmetrical sensing elements across the field of view, in aligned and misaligned optical systems, in accordance with an embodiment of the invention.

FIG. 15 is an illustration of simulated signals, integrated over the numerical aperture of an f/2.2 imaging lens, from asymmetrical sensing elements distributed across the field of view of an imaging system, in accordance with an embodiment of the invention. Two curves 142 and 144 illustrate the response of a system in proper optical alignment from right and left asymmetrical elements, respectively, while curves 146 and 148, from right and left asymmetrical elements, respectively, correspond to misalignment of the imaging lens by 5°. The signals in FIG. 15 are obtained by integrating the sensing element signals in a number of locations in the field (such as those shown in FIGS. 11-14 for two field locations), weighted by the irradiance distribution of the f/2.2 lens, and normalizing by the signals output by the symmetrical sensing elements.

A horizontal axis 138 represents the position in the field of view, with 50% referring to the center of the field of view, and 0% and 100% referring to the left and right edges of the field of view, respectively. A vertical axis 140 represents normalized signals.

A 5° degree shift of the imaging lens (in terms of optical chief ray shift) has the effect of increasing the signals output by the right asymmetrical sensing elements (from curve 142 to curve 146), and decreasing the signals output by the left asymmetrical sensing elements (from curve 144 to curve 148). These shifts are used by control circuit 34 (FIG. 1) in monitoring the transverse misalignment of the imaging lens.

Figure 16:
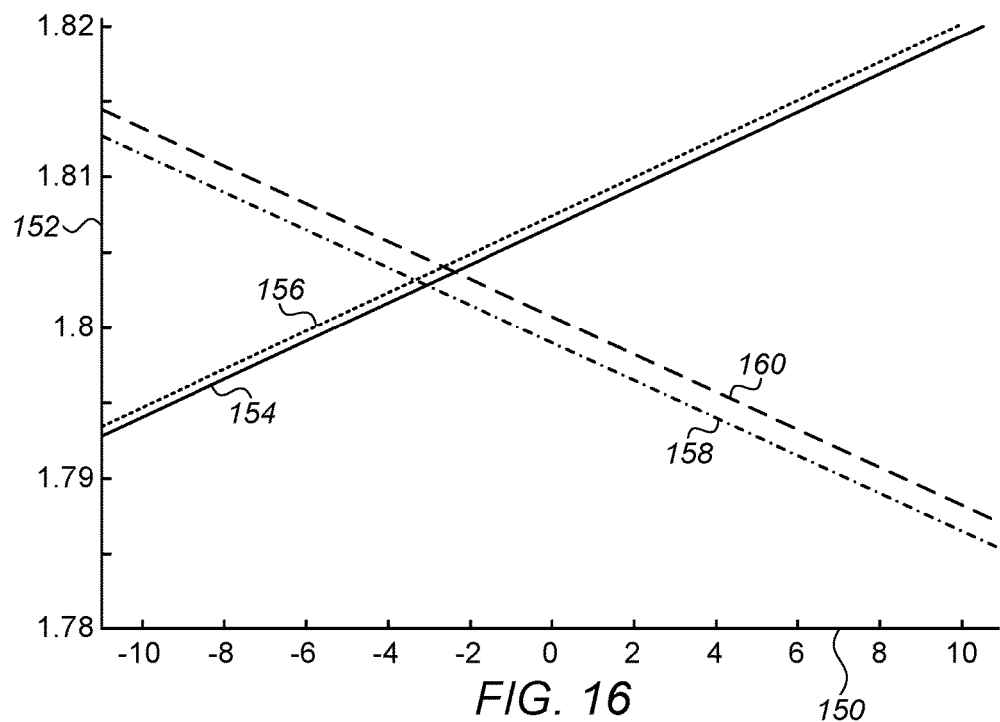
FIG. 16 is an illustration of measured signals output by asymmetrical sensing elements as a function of transverse shift of the imaging lens, in accordance with an embodiment of the invention.
Figure 17:
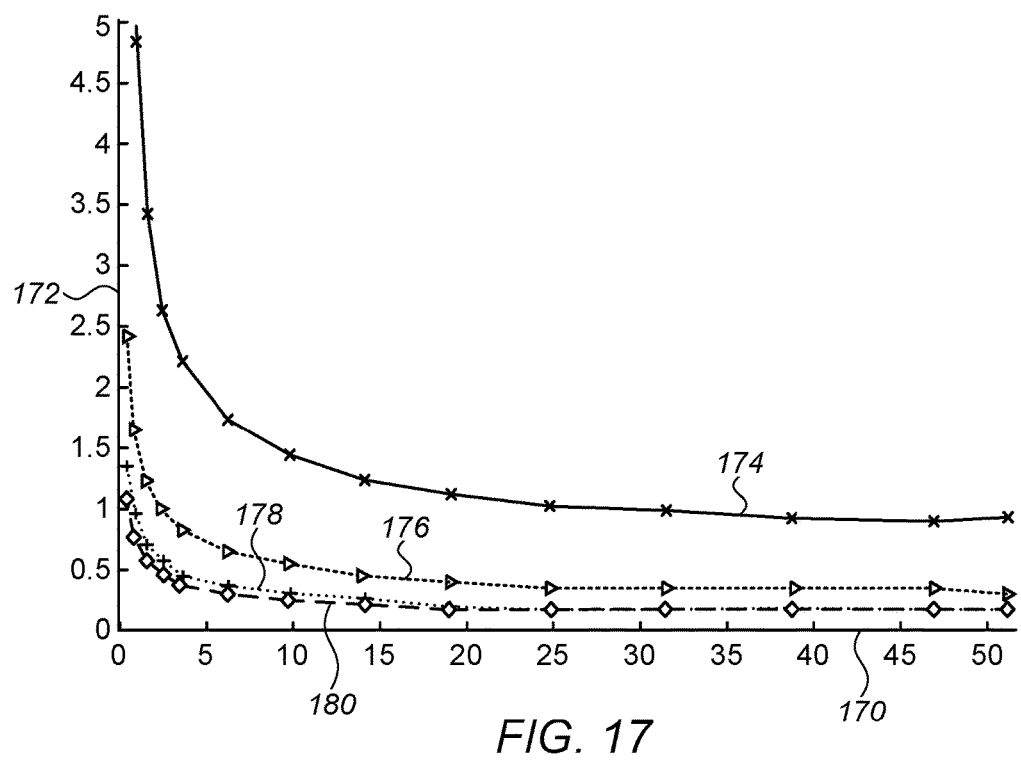
FIG. 17 is an illustration of measured noise-equivalent transverse shift of the imaging lens as a function of the number of asymmetrical sensing elements and the signal level in symmetrical sensing elements, in accordance with an embodiment of the invention.

FIGS. 16-17 are plots that show results based on measured signals using an optical system with an image sensor with symmetrical and asymmetrical sensing elements.

FIG. 16 is an illustration of measured signal levels from four types of "left" and "right" asymmetrical sensing elements, as a function of transverse shift of the imaging lens, in accordance with an embodiment of the invention. The signals from the four types of asymmetrical sensing elements are represented by four curves 154, 156, 158, and 160. A horizontal axis 150 represents the transverse shift of the imaging lens in microns, and a vertical axis 152 represents the calculated gain that must be applied to the asymmetrical sensing elements in order to bring their signals to the average value of the surrounding symmetrical sensing elements. The position of the crossover point of the curves at a non-zero transverse shift represents a positioning tolerance of the experiment.

FIG. 17 is an illustration of measured noise-equivalent transverse shift of the imaging lens in an imaging system as a function of the number of asymmetrical sensing elements and the signal levels in symmetrical sensing elements in the system, in accordance with an embodiment of the invention. A horizontal axis 170 represents the number of asymmetrical sensing elements in the image sensor, in thousands, and a vertical axis 172 represents the noise-equivalent transverse shift of the imaging lens in microns, computed on the basis of the signals output by the asymmetrical sensing elements. The data points were obtained from experiments such as the one illustrated in FIG. 16. The four curves 174, 176, 178, and 180 refer to respective signal levels of 220 electrons, 1430 electrons, 4440 electrons, and 6940 electrons from the symmetrical sensing elements. An accuracy of better than 0.2 microns in computing lens shift may be obtained for a high signal, and an accuracy of better than 0.9 microns may be obtained for a low signal.

Figure 18:
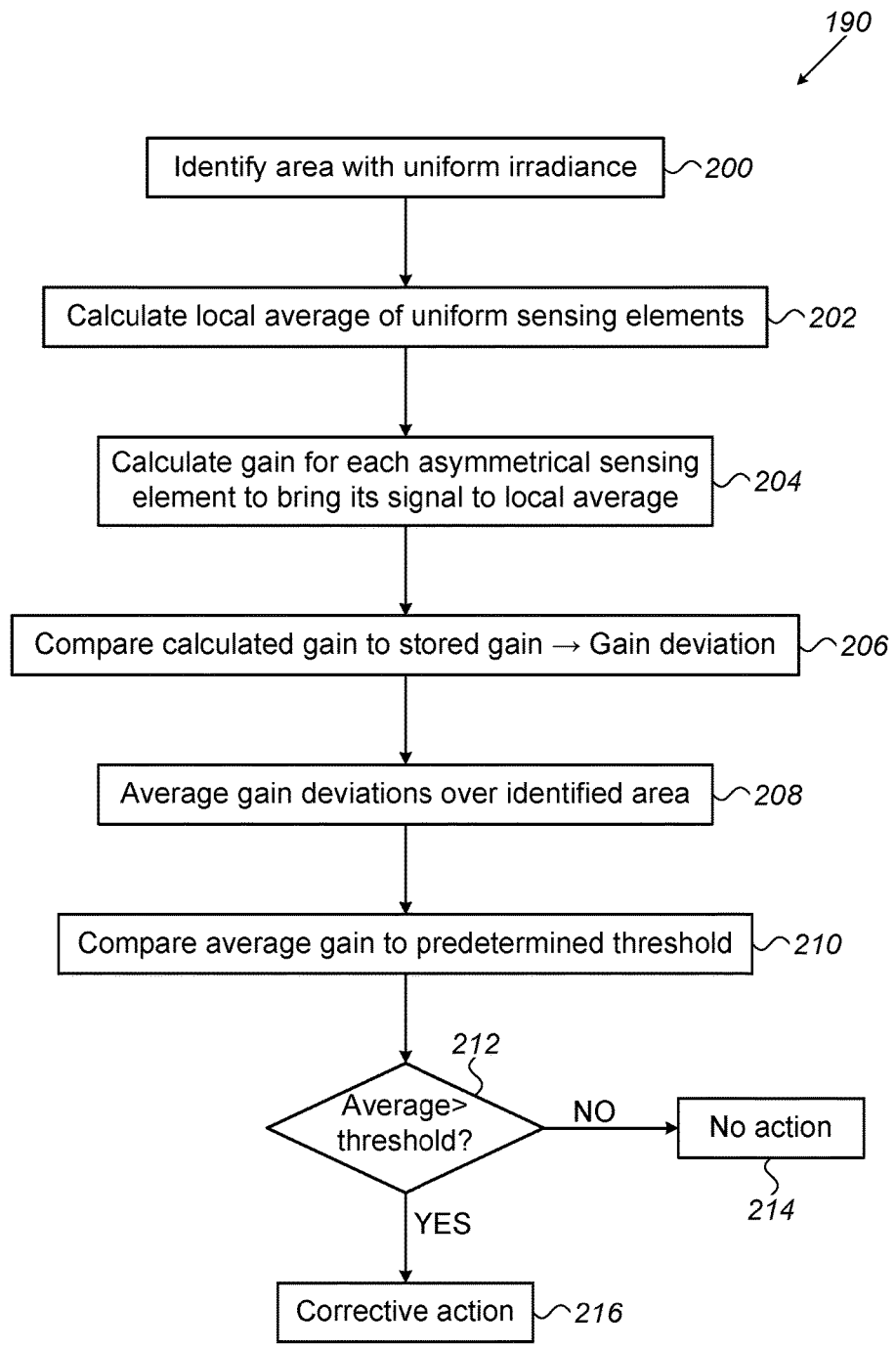
FIG. 18 is a flowchart that schematically illustrates a method for calculating and using a metric for misalignment of an imaging lens, in accordance with an embodiment of the invention.

FIG. 18 is a flowchart 190 that schematically illustrates a method for calculating and using a metric of misalignment of an imaging lens, in accordance with an embodiment of the invention. This method can be applied, for example, by control circuit 34 in monitoring the alignment of imaging system 20.

In an identification step 200, using the signals output by the symmetrical sensing elements in array 24, control circuit 34 identifies an area in the field of view where the irradiance is uniform to within a predetermined threshold value. In an averaging step 202, the average of the signals output by the symmetrical sensing elements in the identified area will be used a reference value. In a gain calculation step 204 control circuit 34 processes the signals output by the asymmetrical sensing elements, whose directions of sensitivity coincide with the direction of misalignment that is to be calculated. For each of these signals, control circuit 34 calculates a gain by dividing the signal output from each of the asymmetrical sensing elements by the reference value.

In a comparison step 206 the gain for each of the asymmetrical sensing elements is compared to a stored gain value, for example by subtracting the gain from a stored gain map, yielding a gain deviation. In a gain deviation averaging step 208 these gain deviations are averaged over the area of uniform irradiance, and in a gain comparison step 210 the average is compared to a predetermined threshold. When the average gain deviation exceeds the threshold in a decision step 212, one or more corrective actions are taken in a corrective action step 216 (for example, re-aligning the optics or recalibrating the image processing algorithms).

Otherwise, if the average gain deviation is below the threshold, no action is taken as per a no-action step 214.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for imaging, comprising:
    imaging a scene using an imaging system, comprising an array of radiation sensing elements, including first sensing elements with symmetrical angular responses and second sensing elements with asymmetrical angular responses, interspersed among the first sensing elements, and optics configured to focus radiation from the scene onto the array;
    processing first signals output by the first sensing elements in order to identify one or more areas of uniform irradiance on the array; and
    processing second signals output by the second sensing elements that are located in the identified areas, in order to monitor a transverse shift of the optics relative to the array,
    wherein the second sensing elements comprise different groups of the second sensing elements having different, respective angles of asymmetry, and wherein monitoring the transverse shift comprises comparing the second signals output by the different groups in order to evaluate a direction of the transverse shift.

2. The method according to claim 1, wherein the second sensing elements comprise:
    a photosensitive region formed in a substrate;
    a microlens disposed over the photosensitive region; and
    an opaque shield interposed between the substrate and the microlens, partially covering the photosensitive region.

3. The method according to claim 1, wherein the second sensing elements comprise:
    at least one photosensitive region formed in a substrate; and
    a microlens, which is disposed over the photosensitive region,
    wherein the at least one photosensitive region is offset with respect to an optical chief ray directed at the sensing element through the microlens.

4. The method according to claim 1, wherein processing the second signals comprises monitoring a tilt of the optics relative to the array.

5. The method according to claim 1, wherein processing the second signals comprises evaluating an angle of an optical chief ray of the optics across the array.

6. The method according to claim 1, wherein processing the second signals comprises calibrating an alignment of the imaging system based on the second signals.

7. The method according to claim 1, wherein processing the second signals comprises verifying that the imaging system has been assembled to within a predetermined tolerance based on the second signals.

8. A method for imaging, comprising:
    imaging a scene using an imaging system, comprising an array of radiation sensing elements, including first sensing elements with symmetrical angular responses and second sensing elements with asymmetrical angular responses, interspersed among the first sensing elements, and optics configured to focus radiation from the scene onto the array;
    processing first signals output by the first sensing elements in order to identify one or more areas of uniform irradiance on the array; and
    processing second signals output by the second sensing elements that are located in the identified areas, in order to detect a transverse shift of the optics relative to the array,
    wherein monitoring the transverse shift comprises:
    calculating a gain for the second sensing elements in the identified areas, by normalizing the second signals relative to the first signals output by the first sensing elements in the identified areas;
    evaluating a deviation of the calculated gain from a stored gain; and
    estimating the transverse shift based on the deviation.

9. A method for imaging, comprising:
    imaging a scene using an imaging system, comprising an array of radiation sensing elements, including first sensing elements with symmetrical angular responses and second sensing elements with asymmetrical angular responses, interspersed among the first sensing elements, and optics configured to focus radiation from the scene onto the array;
    processing first signals output by the first sensing elements in order to identify one or more areas of uniform irradiance on the array; and
    processing second signals output by the second sensing elements that are located in the identified areas, in order to detect a misalignment of the optics with the array,
    wherein processing the second signals comprises:
    storing respective gain maps for a plurality of types of misalignment;
    calculating a gain for the second sensing elements in the identified areas, by normalizing the second signals relative to the first signals output by the first sensing elements in the identified areas; and
    comparing the calculated gain to the stored gain maps in order to identify a type and magnitude of the misalignment.

10. An imaging system comprising:
    an array of radiation sensing elements, comprising:
        first sensing elements with symmetrical angular responses, configured to output first signals; and
        second sensing elements with asymmetrical angular responses, interspersed among the first sensing elements and configured to output second signals;
    optics configured to focus radiation from a scene onto the array; and
    a control circuit coupled to the array and configured to process the first signals in order to identify one or more areas of uniform irradiance on the array and to process the second signals output by the second sensing elements that are located in the identified areas in order to detect a misalignment of the optics with the array,
    wherein the misalignment monitored by the control circuit comprises a transverse shift of the optics relative to the array, and
    wherein the second sensing elements comprise different groups of the second sensing elements having different, respective angles of asymmetry, and
    wherein the control circuit is configured to compare the second signals output by the different groups in order to evaluate a direction of the transverse shift.

11. The imaging system according to claim 10, wherein the second sensing elements comprise:
   a photosensitive region formed in a substrate;
   a microlens disposed over the photosensitive region; and
   an opaque shield interposed between the substrate and the microlens, partially covering the photosensitive region.

12. The imaging system according to claim 10, wherein the second sensing elements comprise:
   at least one photosensitive region formed in a substrate; and
   a microlens, which is disposed over the photosensitive region,
   wherein the at least one photosensitive region is offset with respect to an optical chief ray directed at the sensing element through the microlens.

13. The imaging system according to claim 10, wherein the misalignment monitored by the control circuit comprises a tilt of the optics relative to the array.

14. The imaging system according to claim 10, wherein the control circuit is configured to evaluate an angle of an optical chief ray of the optics across the array by processing the second signals.

15. The imaging system according to claim 10, wherein the control circuit is configured to calibrate an alignment of the imaging system based on the second signals.

16. The imaging system according to claim 10, wherein the control circuit is configured to verify that the imaging system has been assembled to within a predetermined tolerance based on the second signals.

\* \* \* \* \*